(12) United States Patent
Chen et al.

(10) Patent No.: US 9,941,299 B1
(45) Date of Patent: Apr. 10, 2018

(54) THREE-DIMENSIONAL FERROELECTRIC MEMORY DEVICE AND METHOD OF MAKING THEREOF

(71) Applicant: SANDISK TECHNOLOGIES LLC, Plano, TX (US)

(72) Inventors: Yangyin Chen, Leuven (BE); Christopher Petti, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/604,092

(22) Filed: May 24, 2017

(51) Int. Cl.
*G11C 11/22* (2006.01)
*H01L 27/11597* (2017.01)
*H01L 27/1159* (2017.01)

(52) U.S. Cl.
CPC .... *H01L 27/11597* (2013.01); *G11C 11/2257* (2013.01); *G11C 11/2275* (2013.01); *H01L 27/1159* (2013.01)

(58) Field of Classification Search
CPC . G11C 11/2257; G11C 11/2275; G11C 11/22; H01L 27/11597; H01L 27/1159
USPC .................................................. 365/130, 145
See application file for complete search history.

(56) References Cited

U.S. PATENT DOCUMENTS

| 5,915,167 | A | 6/1999 | Leedy |
| 8,349,681 | B2 | 1/2013 | Alsmeier et al. |
| 9,589,839 | B1 | 3/2017 | Ikawa et al. |
| 2012/0201080 | A1* | 8/2012 | Kang ................ G11C 16/0483 365/185.11 |
| 2016/0181259 | A1* | 6/2016 | Van Houdt ......... H01L 27/1159 365/145 |

OTHER PUBLICATIONS

Muller, J. et al., "Ferroelectric Hafnium Oxide Based Materials and Devices: Assessment of Current Status and Future Prospects," ECS Journal of Solid State Science and Technology, vol. 4, No. 5, pp. N30-N35, (2015).

* cited by examiner

*Primary Examiner* — Tan T. Nguyen
(74) *Attorney, Agent, or Firm* — The Marbury Law Group PLLC

(57) ABSTRACT

A three-dimensional memory device includes an alternating stack of word lines and insulating layers, vertical semiconductor channels vertically extending through the alternating stack, and a ferroelectric memory material located between each vertical semiconductor channel and the word lines.

19 Claims, 15 Drawing Sheets

US 9,941,299 B1

THREE-DIMENSIONAL FERROELECTRIC MEMORY DEVICE AND METHOD OF MAKING THEREOF

FIELD

The present disclosure relates generally to the field of semiconductor devices, and particular to a three-dimensional ferroelectric memory device, and methods of manufacturing the same.

BACKGROUND

A ferroelectric memory device is a memory device containing a ferroelectric material to store information. The ferroelectric material acts as the memory material of the memory device. The dipole moment of the ferroelectric material is programmed in two different orientations (e.g., "up" or "down" polarization positions based on oxygen atom position in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a planar field effect transistor ferroelectric memory device.

SUMMARY

According to an aspect of the present disclosure, a three-dimensional memory device is provided, which comprises an alternating stack located over a substrate, wherein the alternating stack comprises alternating insulating layers and electrically conductive layers, and wherein the electrically conductive layers comprise word lines of the three-dimensional memory device, vertical semiconductor channels vertically extending through the alternating stack, and ferroelectric memory elements located between each vertical semiconductor channel and the electrically conductive layers of the alternating stack.

According to another aspect of the present disclosure, a method of forming a three-dimensional memory device comprises forming an alternating stack of insulating layers and sacrificial material layers over a substrate, forming vertical semiconductor channels through the alternating stack, and replacing the sacrificial material layers with combined spacers, each of which comprises a ferroelectric liner and an electrically conductive layer, after forming the vertical semiconductor channels.

According to another aspect of the present disclosure, a ferroelectric three-dimensional memory device comprises an alternating stack of word lines and insulating layers, a vertical semiconductor channel, a source region, a drain region and a ferroelectric memory elements. A method operating the device comprises writing a selected first ferroelectric memory material element between a selected word line and the vertical semiconductor channels into a state that locally decreases a threshold voltage inside the vertical semiconductor channel at a level of the selected word line by applying a current flow bias voltage across the source region and the drain region of the vertical semiconductor channel, a selected word line voltage to the selected word line, wherein the selected word line voltage is a greater positive voltage with respect to voltages applied to the source region and the drain region, and an unselected word line voltage to each unselected word line that is less positive than the selected word line voltage.

DETAILED DESCRIPTION

Figure 1:
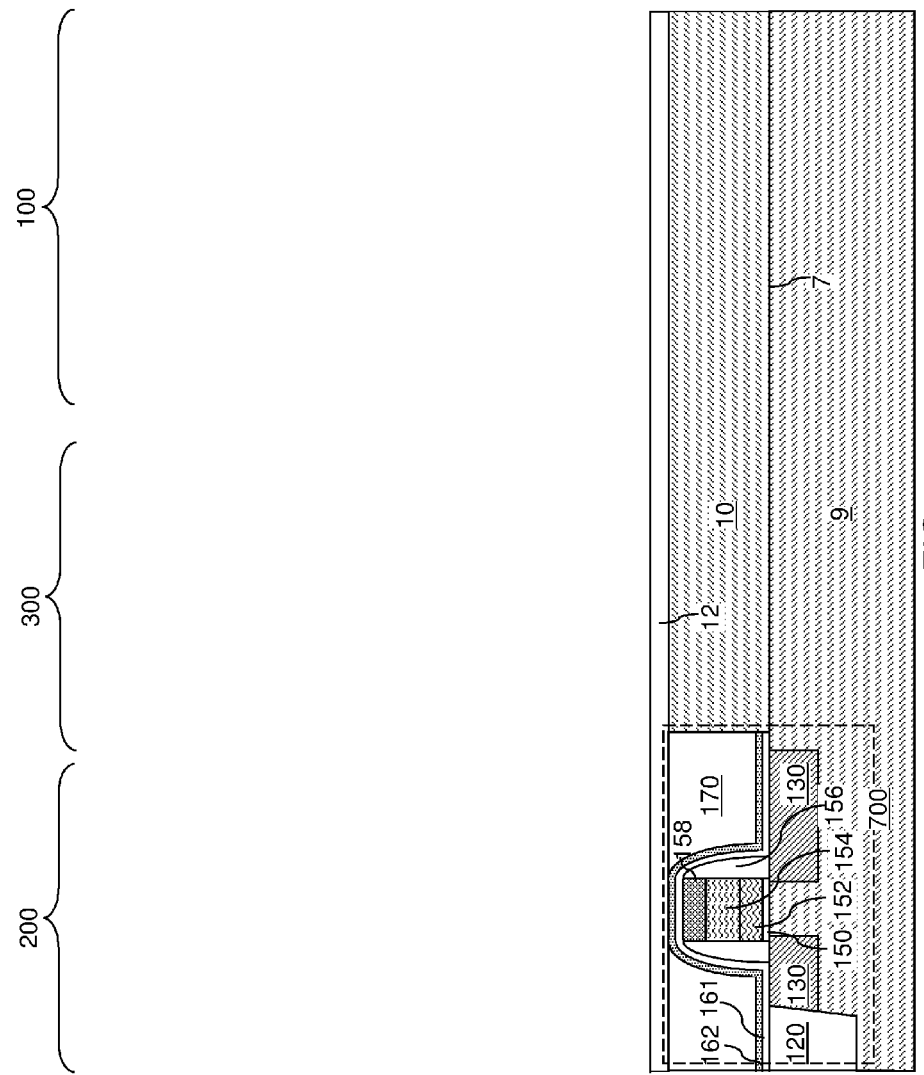
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional ferroelectric memory device containing a ferroelectric memory element, and methods of manufacturing the same, the various aspects of which are described below. The embodiments of the disclosure can be employed to form a three-dimensional monolithic device comprising a plurality of vertical ferroelectric memory strings. Each vertical ferroelectric memory string includes a one-dimensional array of ferroelectric memory elements. The vertical ferroelectric memory strings can be arranged as a two-dimensional array so that the ferroelectric memory elements form a three-dimensional array.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Referring to FIG. 1, an exemplary structure according to an embodiment of the present disclosure is illustrated, which can be employed, for example, to fabricate a device structure containing a three-dimensional array of ferroelectric memory elements. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include a three-dimensional array of ferroelectric memory elements.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
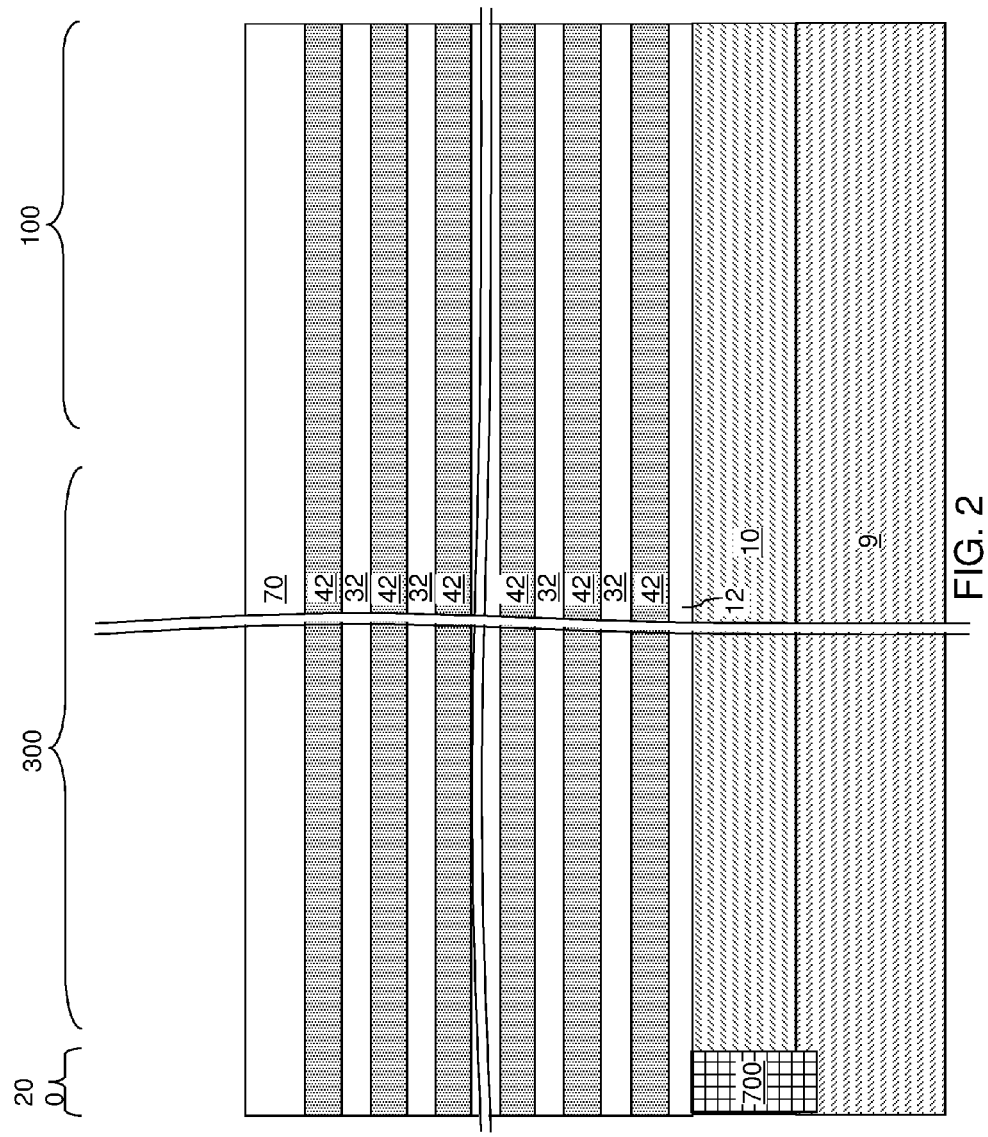
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 is a sacrificial material that can be subsequently removed selective to the first material of the insulating layers 32. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that combined spacers are to be subsequently formed in the volumes of the sacrificial material layers 42. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The thickness of the sacrificial material layers 42 can be selected to be greater than twice the thickness of a ferroelectric material liner to be subsequently formed so that each sacrificial material layer 42 can be subsequently replaced with a respective combination of a ferroelectric material liner and an electrically conductive layer. In an illustrative example, the thickness of each sacrificial material layer 42 can be the same, and can be in a range from 20 nm to 40 nm. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
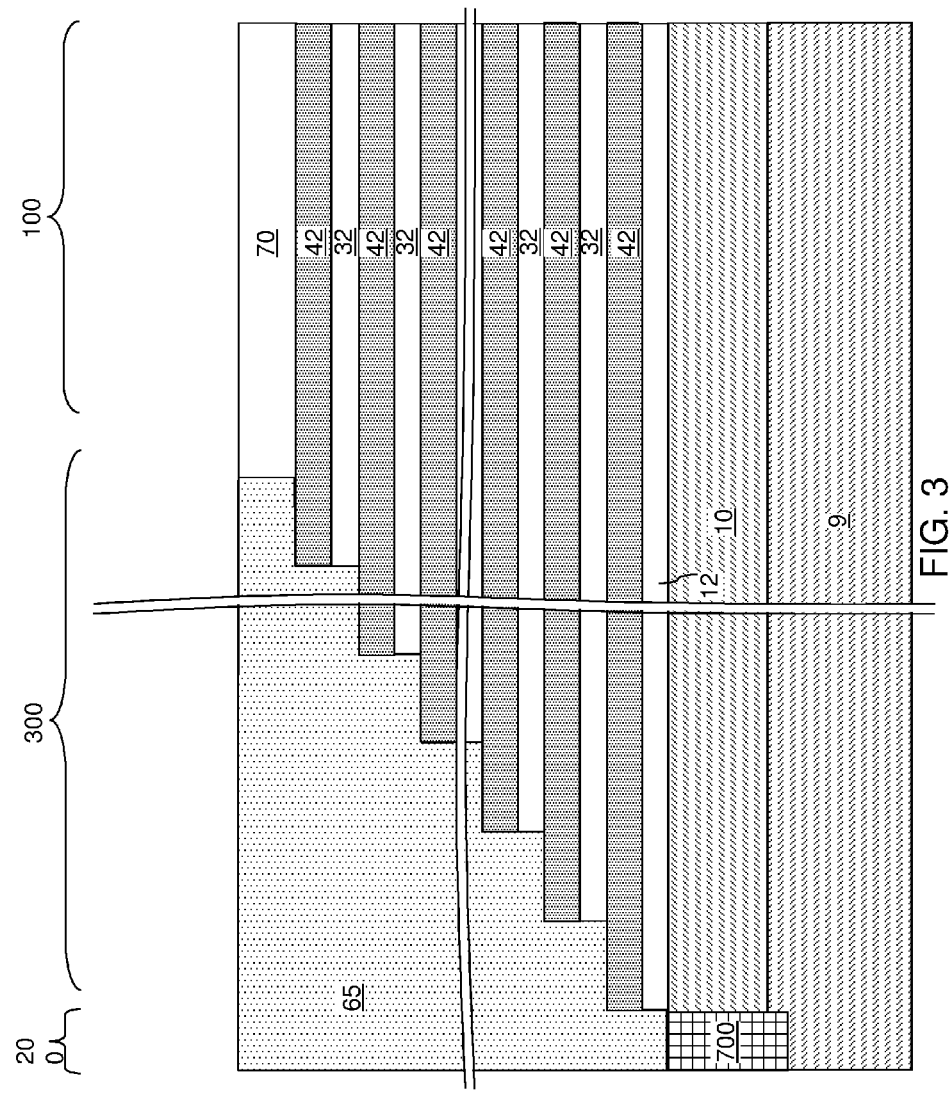
FIG. 3 is a schematic vertical cross-sectional view of the exemplary structure after formation of stepped terraces and a retro-stepped dielectric material portion according to an embodiment of the present disclosure.

Referring to FIG. 3, the alternating stack (32, 42) can be patterned to form a terrace region in which each sacrificial material layer 42 except a topmost sacrificial material layer has a greater lateral extent than overlying sacrificial material layers 42. A stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10).

In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than overlying sacrificial material layers 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity over the patterned alternating stack (32, 42) by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
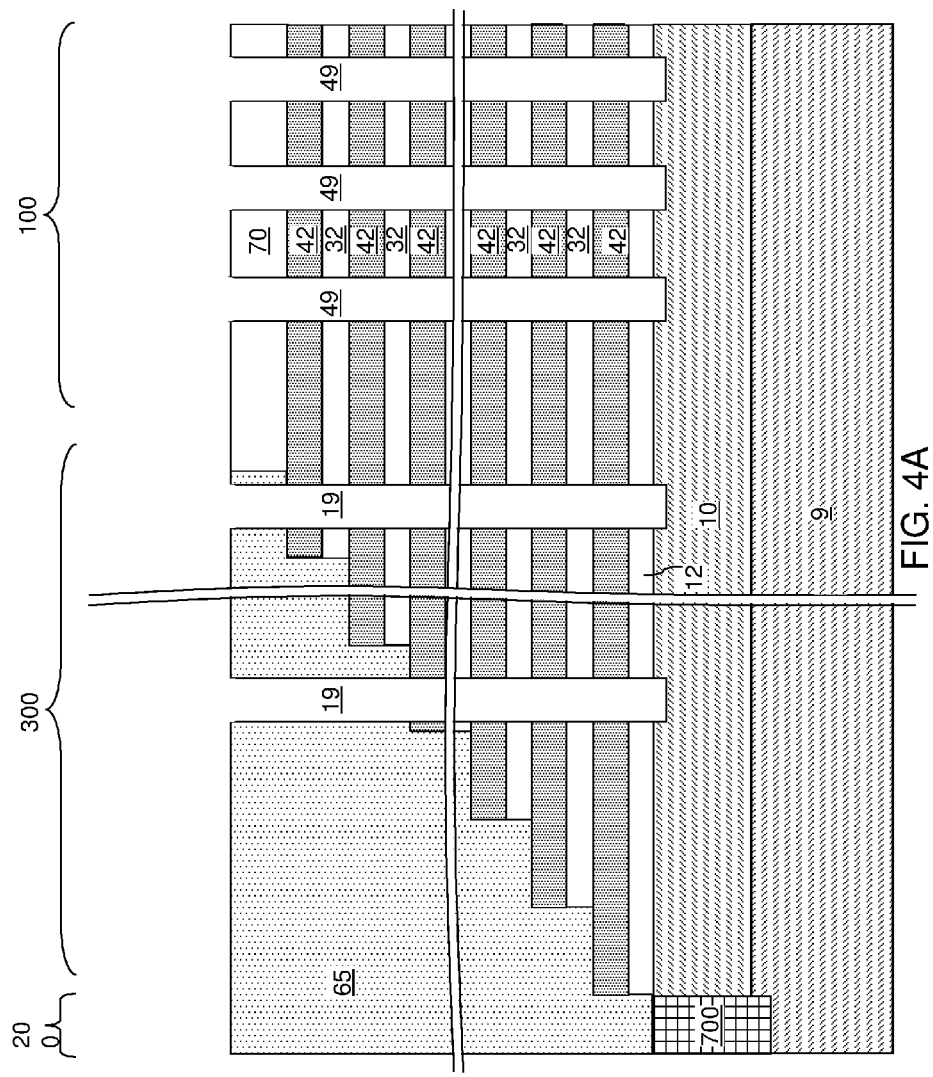
FIG. 4A is a schematic vertical cross-sectional view of the exemplary structure after formation of memory openings and support openings according to an embodiment of the present disclosure.
Figure 4B:
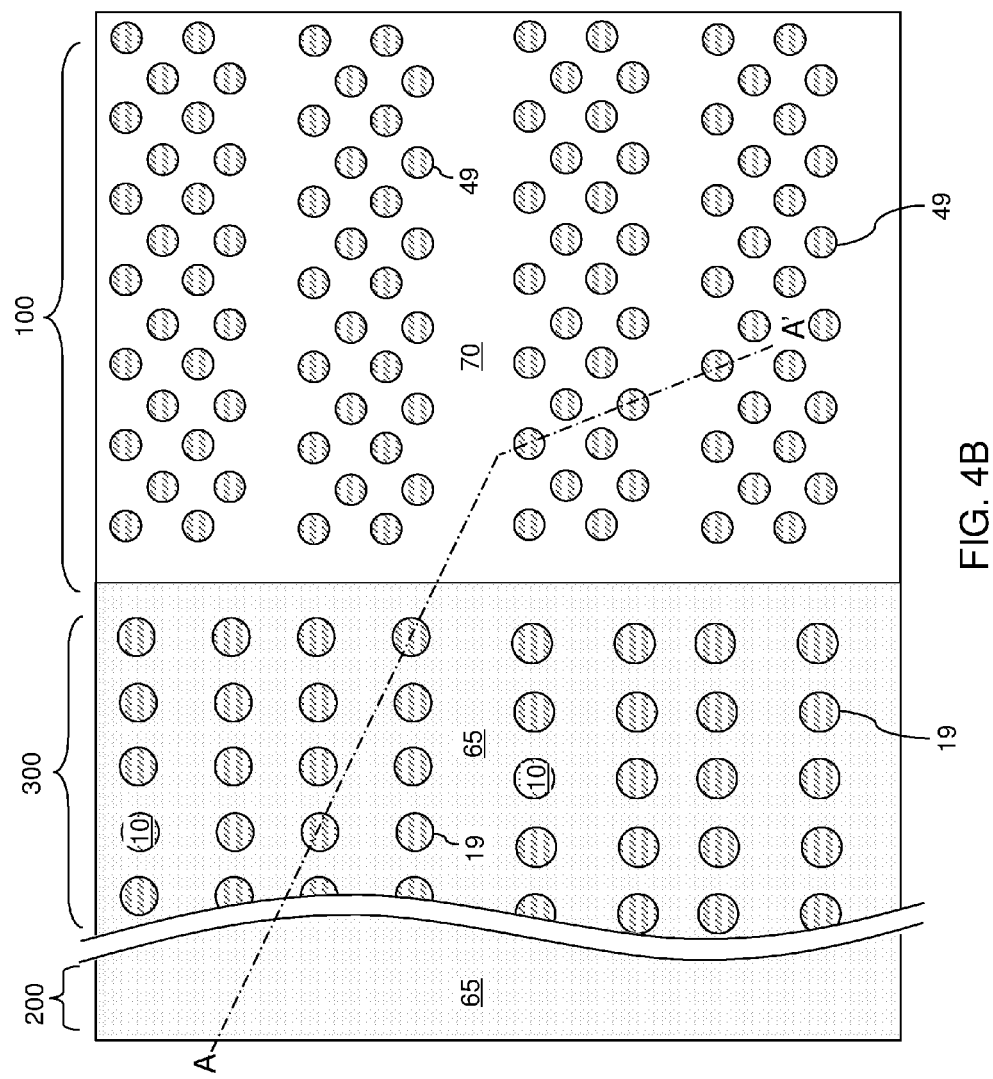
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory opening fill structure, is subsequently formed. As used herein, a "support opening" refers to a structure in which a support pillar structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100.

A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5:
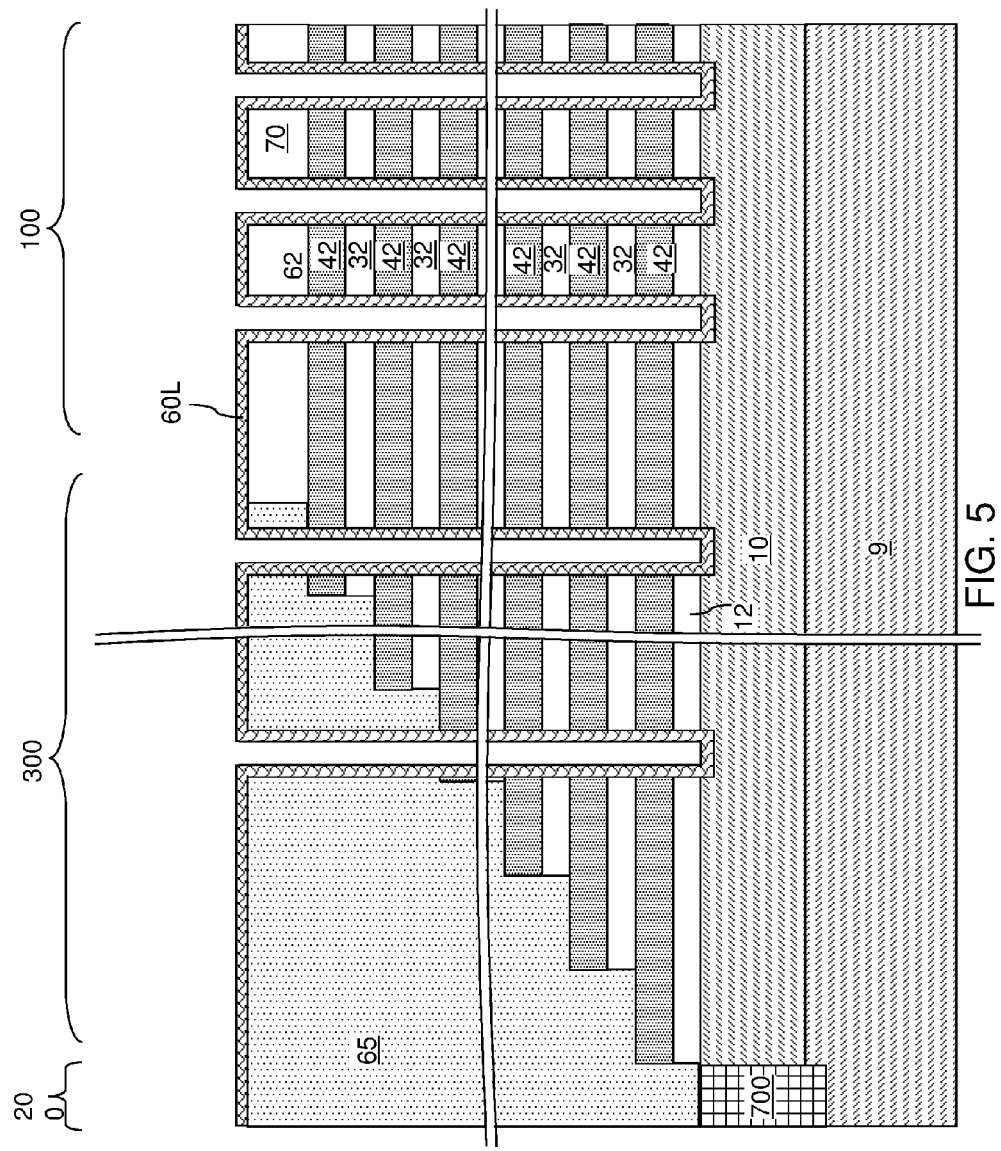
FIG. 5 is a schematic vertical cross-sectional view of the exemplary structure after formation of a semiconductor channel layer according to an embodiment of the present disclosure.

Referring to FIG. 5, a semiconductor channel layer 60L is deposited by a conformal deposition process in the memory opening 49. The semiconductor channel layer 60L can be formed directly on physically exposed portions of the top surface of the semiconductor material layer 10.

The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 3 nm to 30 nm, although lesser and greater thicknesses can also be employed. In one embodiment, the semiconductor channel layer 60L can have a doping of the first conductivity type. If the thickness of the semiconductor channel layer 60L is less than the radius of the memory openings 49, a memory cavity may be formed in the volume of each memory opening 49 that is not filled with the semiconductor channel layer 60L.

Figure 6:
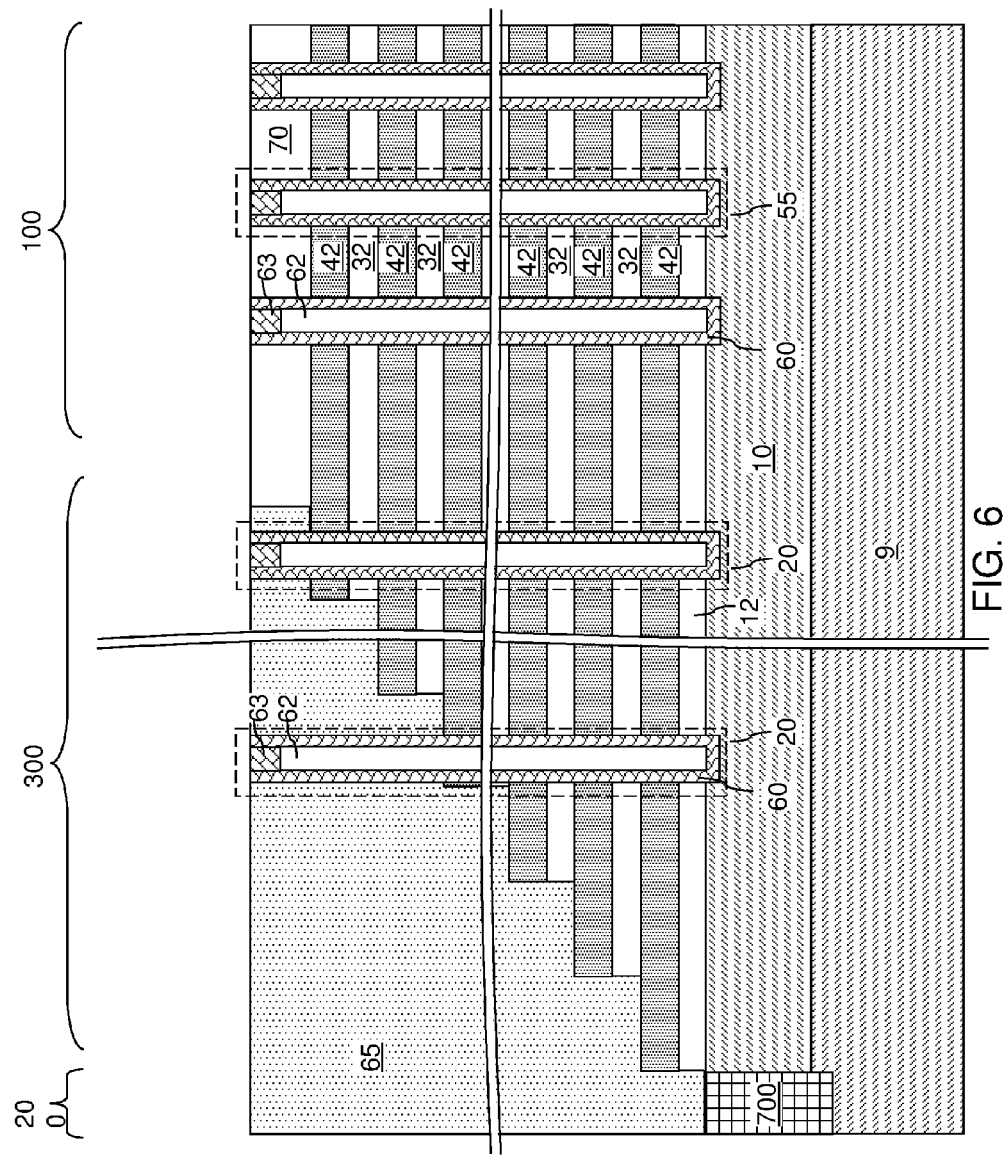
FIG. 6 is a schematic vertical cross-sectional view of the exemplary structure after formation of memory opening fill structures and support pillar structures according to an embodiment of the present disclosure.

Referring to FIG. 6, in case the memory openings 49 are not completely filled by the semiconductor channel layer 60L, a dielectric core material can be deposited in the memory cavities to fill any unfilled volume within the memory openings 49. The dielectric core material is a dielectric material as silicon oxide or organosilicate glass. The dielectric core material can be deposited by a conformal deposition method such as low pressure chemical vapor deposition (LPCVD), or by a self-planarizing deposition process such as spin coating.

Portions of the dielectric core material and the semiconductor channel layer 60L can be removed from above the top surface of the insulating cap layer 70 by a planarization process. For example, a recess etch process and/or chemical mechanical planarization (CMP) can be employed to remove the portions of the dielectric core material and the semiconductor channel layer 60L from above the top surface of the insulating cap layer 70. Each remaining portion of the dielectric core layer constitutes a dielectric core 62. Each remaining portion of the semiconductor channel layer 60L in a memory opening 49 or in a support opening 19 constitutes a vertical semiconductor channel 60. Each vertical semiconductor channel 60 in the memory array region 100 vertically extends through each of the layers within the alternating stack (32, 42). A predominant subset of the vertical semiconductor channels 60 in the contact region 300 vertically extends through a subset of layers within the alternating stack (32, 42) that is less than all layers within the alternating stack (32, 42). As used herein, a "predominant subset" refers to a subset that includes more than one half of all elements within a set.

The top surface of each dielectric core 62 can be vertically recessed, for example, by a recess etch to a depth such that the recessed top surface is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Alternatively, the drain regions 63 can be formed by ion implantation of dopants into the upper part of the semiconductor channel 60 or into a semiconductor material deposited on top of the recesses semiconductor channel 60. In one embodiment, the drain regions 63 can be activated by annealing at a temperature above 850 degrees Celsius. Alternatively, the drain regions 63 can be activated at the same time as the subsequently formed source region(s) 61 during a subsequent step.

Each combination of a vertical semiconductor channel 60, a dielectric core 62, and a drain region 63 within a memory opening 49 constitutes a memory opening fill structure 55. Each combination of a vertical semiconductor channel 60, a dielectric core 62, and a drain region 63 within a support opening 19 constitutes a support pillar structure 20. Each of the vertical semiconductor channels 60 is formed directly on the semiconductor material layer 10. The drain regions 63 can be formed at an upper end of each of the vertical semiconductor channels 60.

Figure 7A:
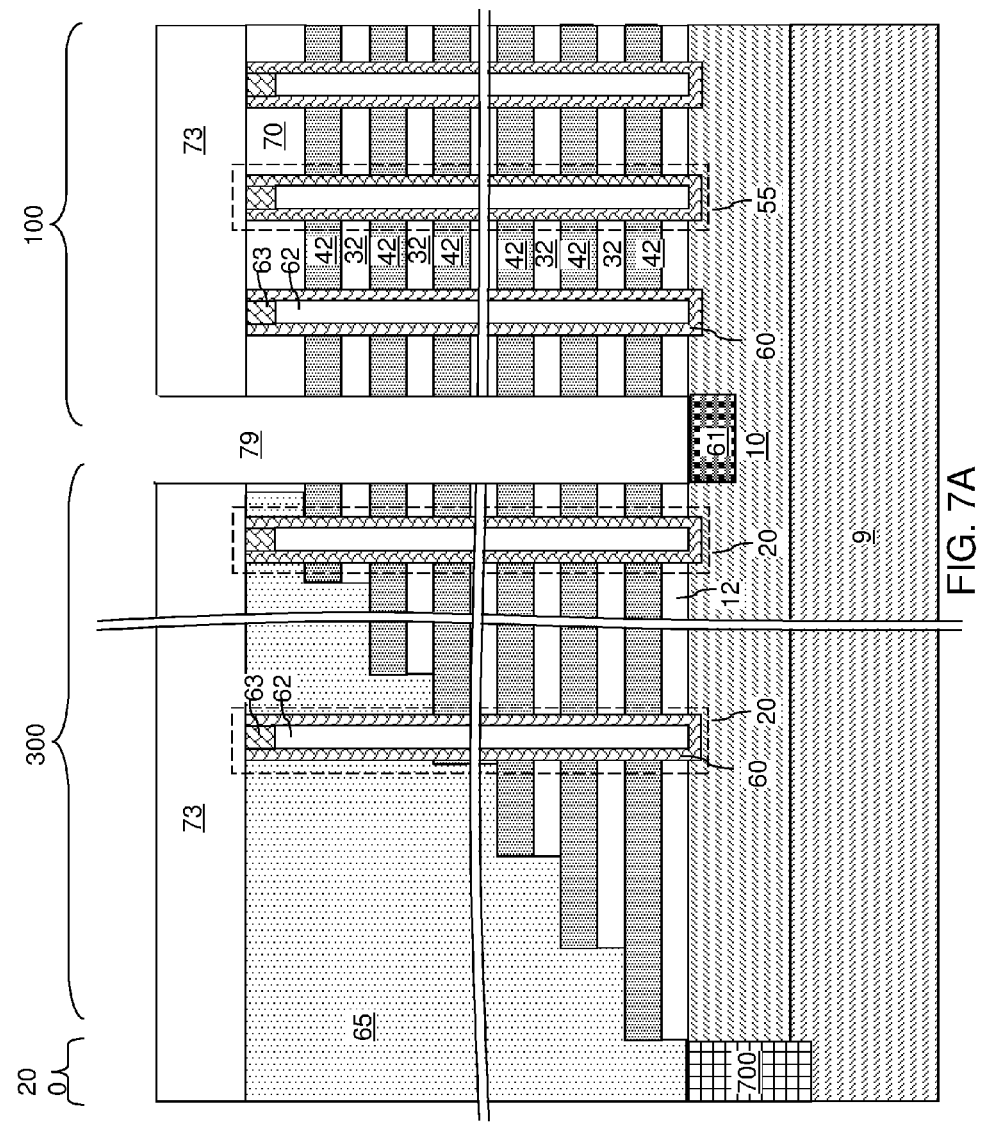
FIG. 7A is a schematic vertical cross-sectional view of the exemplary structure after formation of a backside trench according to an embodiment of the present disclosure.
Figure 7B:
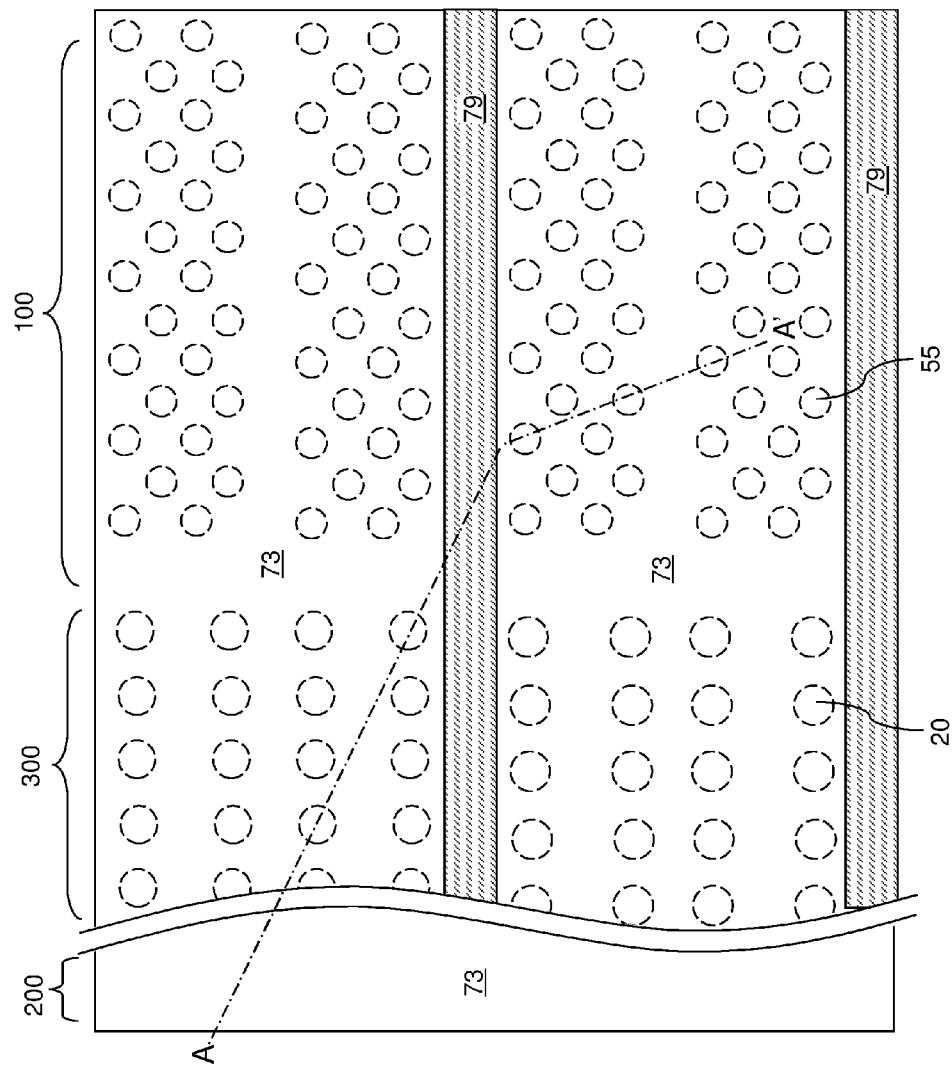
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory opening fill structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

A source region 61 can be formed in, or on, the semiconductor material layer 10 at a location that is laterally offset from the vertical semiconductor channels 60. For example, a source region 61 can be formed at a surface portion of the semiconductor material layer 10 under each backside trench 79 by implantation of electrical dopants into physically exposed surface portions of the semiconductor material layer 10 through the backside trench 79. Each source region 61 is formed in a surface portion of the substrate (9, 10) that underlies a respective backside trench 79. Alternatively, a selective epitaxy process may be employed to form a source region on each physically exposed top surface of the semiconductor material layer 10 at the bottom portions of the backside trenches 79. The source regions 61 and optionally the drain regions 63 can be activated at this time by annealing the in-process device at a temperature above 850 degrees Celsius, such as 900 to 1200 degrees Celsius. In general, the source and/or drain activation annealing step is preferably performed prior to deposition of the ferroelectric material layer (i.e., before formation of the ferroelectric memory element), since the activation annealing step temperature is typically above the temperature at which a ferroelectric orthorhombic phase metal oxide material transitions to a non-ferroelectric monoclinic phase of the same material. Thus, by activating the source and/or drain regions prior to forming the ferroelectric memory element, the orthorhombic metal oxide material of the ferroelectric memory element is not converted to the non-ferroelectric monoclinic phase.

Figure 8:
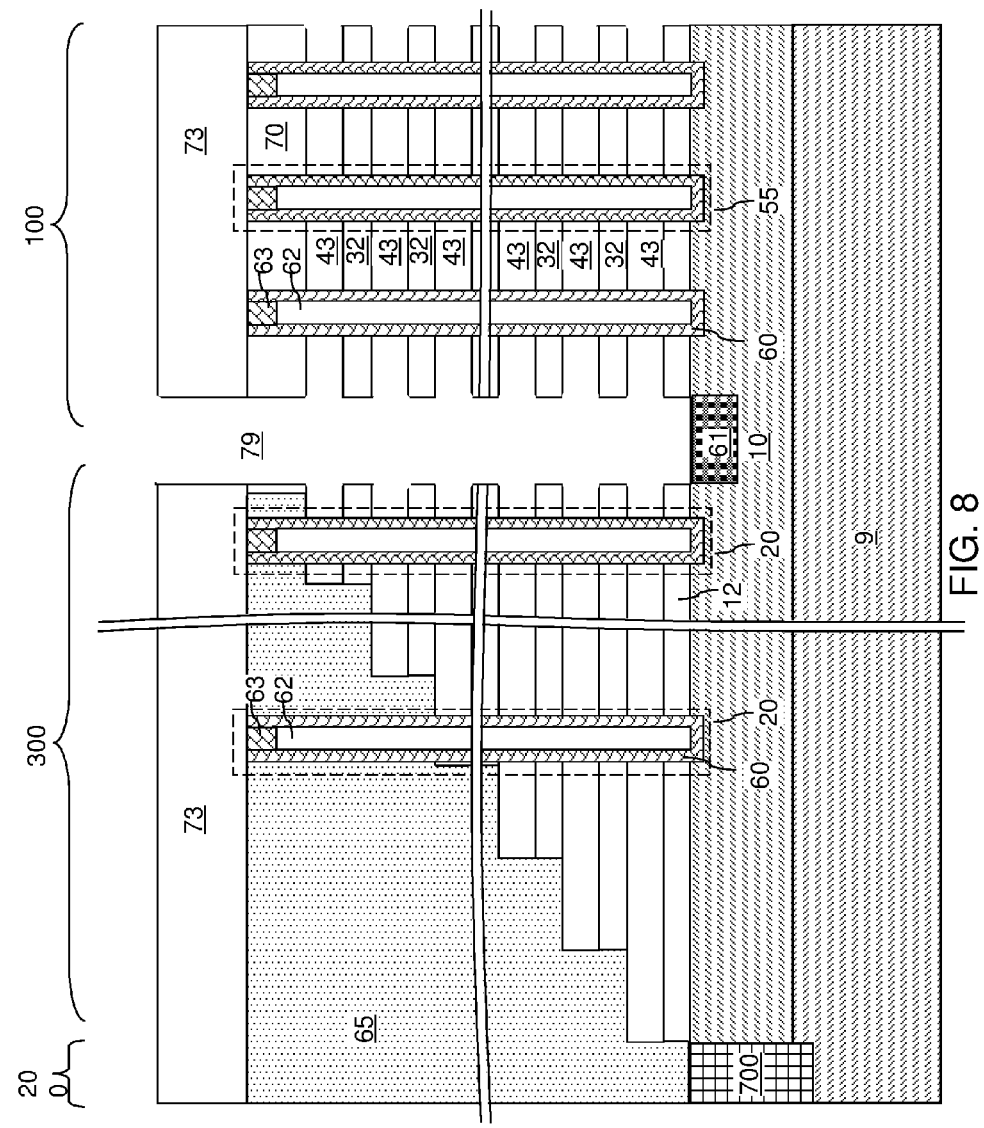
FIG. 8 is a schematic vertical cross-sectional view of the exemplary structure after formation of backside recesses according to an embodiment of the present disclosure.

Referring to FIG. 8, the sacrificial material layers 42 can be removed by providing an etchant that etches the sacrificial material layers 42 selective to the insulating layers 32 through the backside trenches 79. Specifically, an etchant that etches the sacrificial material layers 42 selective to the insulating layers 32 can be provided through the backside trenches 79. The etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the semiconductor channel 60. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the semiconductor channel 60 an be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 55 are formed are herein referred to as front side openings or front side cavities in contrast with the backside recesses 43.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 9:
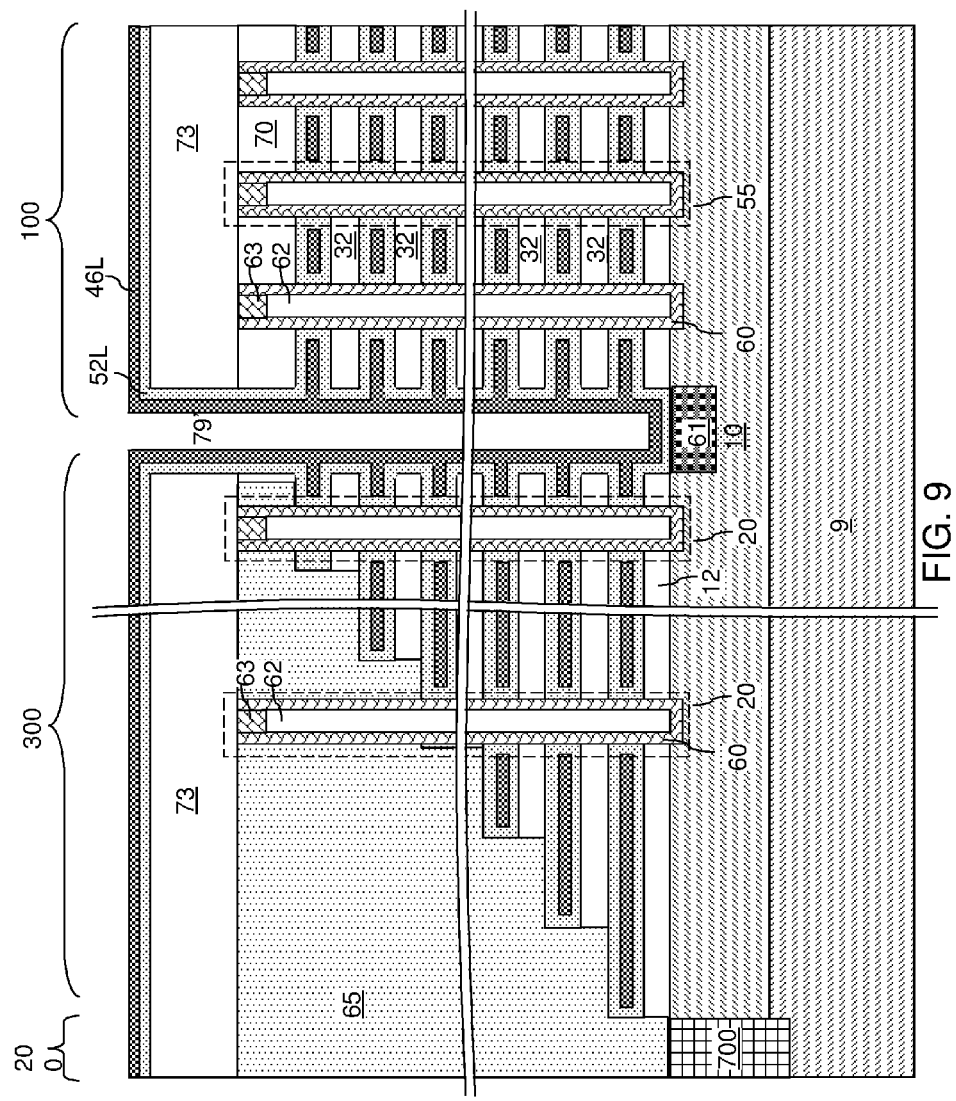
FIG. 9 is a schematic vertical cross-sectional view of the exemplary structure after deposition of a continuous ferromagnetic material layer and an electrically conductive material according to an embodiment of the present disclosure.

Referring to FIG. 9, a continuous ferroelectric material layer, such as a ferroelectric material liner 52L can be deposited in the backside recesses 43. Preferably, the ferroelectric material liner 52L is deposited by the replacement method toward the end of the device fabrication process after the high temperature processing steps, such as after the source 61 and/or drain 63 activation anneal(s), to avoid converting the liner 52L into a non-ferroelectric monoclinic phase. The continuous ferroelectric material liner 52L includes a ferroelectric material. As used herein, a "ferroelectric material" refers to a material that displays a spontaneous electric polarization even when there is no applied electric field and that has the polarization that can be reversed by the application of an external electric field.

In one embodiment, the continuous ferroelectric material liner 52L includes an orthorhombic metal oxide of which a unit cell has a non-zero permanent electric dipole moment. In one embodiment, the orthorhombic metal oxide comprises an orthorhombic hafnium doped zirconium oxide or an orthorhombic hafnium oxide doped with a dopant having an atomic radius that is between 40% smaller than to 15% larger than the atomic radium of hafnium. For example, the orthorhombic metal oxide can comprise an orthorhombic phase hafnium oxide doped with at least one of silicon, aluminum, yttrium, gadolinium and zirconium. The atomic concentration of the dopant atoms (e.g., Al atoms) can be in a range from 0.5% to 16.6%. In one embodiment, the atomic concentration of the dopant atoms can be greater than 1.0%, 2.0%, 3.0%, 5.0%, 7.5%, and/or 10%. Alternatively or additionally, the atomic concentration of the dopant atoms can be less than 15%, 12.5%, 10%, 7.5%, 5.0%. 3.0%, and/or 2.0%.

The orthorhombic phase of the orthorhombic metal oxide can be a doping-induced non-centrosymmetric crystalline phase that generates a remanent dipole moment upon application and removal of an external electric field. Specifically, polarization of the oxygen atoms with respect to the metal atoms in the orthorhombic metal oxide can induce non-centrosymmetric charge distribution due to the positions (e.g., up or down positions) of the oxygen atoms in the orthorhombic lattice.

The continuous ferroelectric material liner 52L can be deposited by a conformal deposition method such as atomic layer deposition or chemical vapor deposition. For example, a metal-organic precursor gas and oxygen gas can be alternately or simultaneously flowed into a processing chamber to deposit the continuous ferroelectric material liner 52L. The deposited material of the continuous ferroelectric material liner 52L can be annealed at an elevated temperature that induces formation of the orthorhombic phase in the continuous ferroelectric material layer 52L. Temperature for formation of the orthorhombic metal oxide material in the continuous ferroelectric material layer 52L can be in a range from 450 degrees Celsius to 850 degrees Celsius, and typically has a window of about 200 degrees Celsius that depends on the composition of the metal oxide. After deposition, the ferroelectric material layer 52L can be annealed at a temperature of 500 to 850 degrees Celsius, such as 500 to 700, such as 550 to 600 degrees Celsius to increase the amount of the orthorhombic phase in the layer 52L. Preferably, the device is not subjected to a temperature above 850 degrees Celsius after the deposition and anneal of the continuous ferroelectric material layer 52L.

The average thickness of the continuous ferroelectric material liner 52L can be in a range from 5 nm to 30 nm, such as from 6 nm to 12 nm, although lesser and greater average thicknesses can also be employed. As used herein, a "thickness" refers to the average thickness unless indicated otherwise. The continuous ferroelectric material layer 52L can have a thickness variation that is less than 30% from an average thickness. In one embodiment, the thickness variation of the continuous ferroelectric material layer 52L can be less than 20%, less than 10%, and/or less than 5% of the average thickness of the continuous ferroelectric material layer 52L.

A conductive material can be deposited in remaining volumes of the backside recesses 43 and on the sidewalls of the at least one the backside trench 79 and over the physically exposed surfaces of the continuous ferroelectric material layer 52L to form a continuous metallic fill material layer 46L. Thus, the conductive material is deposited in remaining volumes of the backside recesses 43 and on portions of the continuous ferroelectric material liner 52L in the backside trenches 79. The metallic fill material can be deposited by a conformal deposition method, which can be, for example, chemical vapor deposition (CVD), atomic layer deposition (ALD), electroless plating, electroplating, or a combination thereof. In one embodiment, the continuous metallic fill material layer 46L can consist essentially of at least one elemental metal. The at least one elemental metal of the continuous metallic fill material layer 46L can be selected, for example, from tungsten, cobalt, ruthenium, titanium, and tantalum. In one embodiment, the continuous metallic fill material layer 46L can consist essentially of a single elemental metal. In one embodiment, the continuous metallic fill material layer 46L can be deposited employing a fluorine-containing precursor gas such as $WF_6$. The continuous metallic fill material layer 46L is spaced from the insulating layers 32 and the memory opening fill structures 55 by the continuous ferroelectric material liner 52L.

Figure 10:
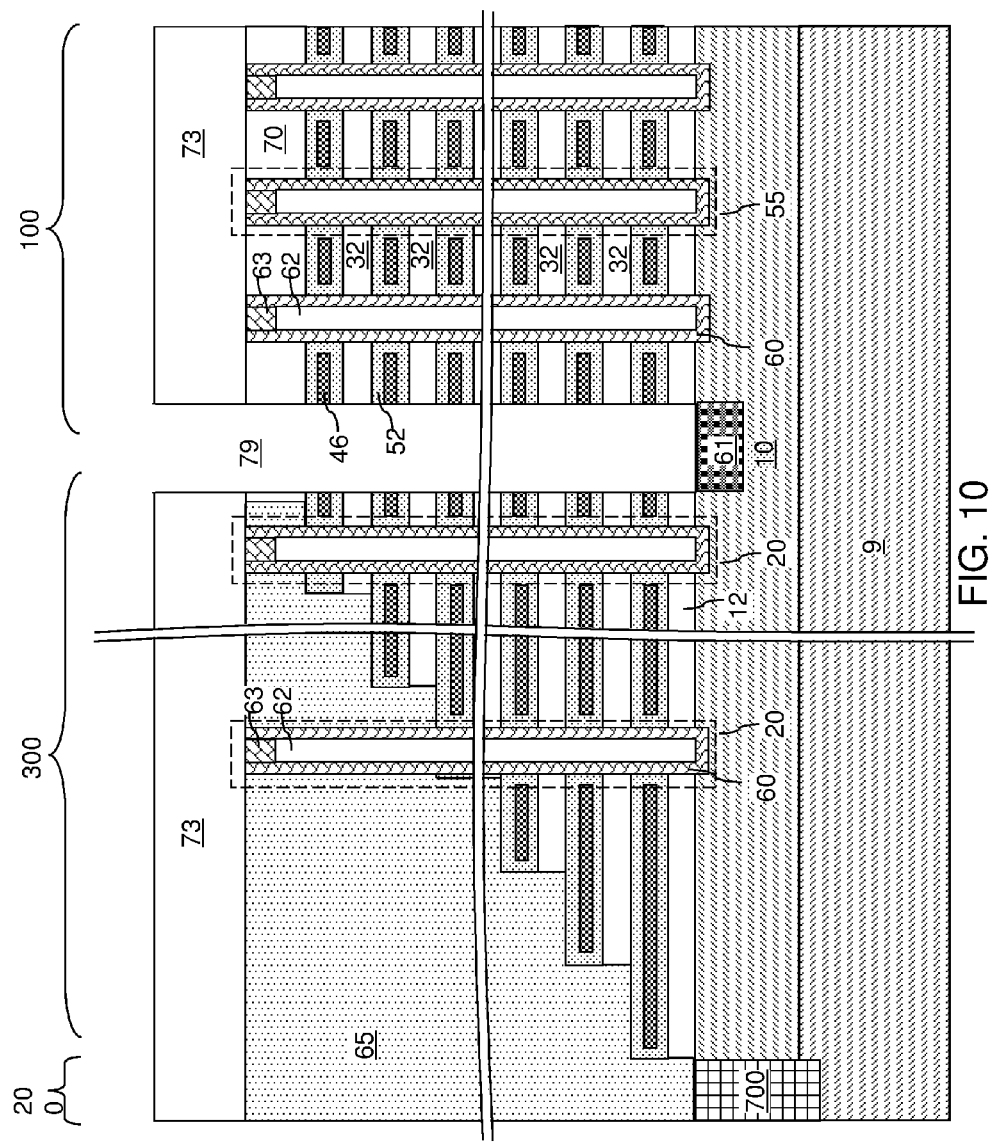
FIG. 10 is a schematic vertical cross-sectional view of the exemplary structure after removal of portions of the deposited electrically conductive material and the continuous ferromagnetic material layer from within the backside trench according to an embodiment of the present disclosure.

Referring to FIG. 10, the deposited conductive material of the continuous electrically conductive material layer 46L and the material of the continuous ferroelectric material liner 52L can be etched back from inside each backside trench 79 and from above the contact level dielectric layer 73, for example, by an isotropic wet etch, an anisotropic dry etch, or a combination thereof. Each remaining portion of the continuous ferroelectric material liner 52L in the backside recesses 43 constitutes a ferroelectric memory material, such as a ferroelectric material liner 52. If desired, the annealing step at a temperature between 500 and 850 degrees Celsius may be conducted on the ferroelectric material liner 52 after the etching step. Each remaining portion of the continuous electrically conductive material layer 46L constitutes an electrically conductive layer 46, which may be a metal layer. Each adjoining pair of a ferroelectric material liner 52 and an electrically conductive layer 46 constitutes a combined spacer (46, 52). Thus, the sacrificial material layers 42 are replaced with combined spacers (46, 52) by filling each of the backside recesses 43 with a respective one of the combined spacers (46, 52). The ferroelectric material liners 52 are formed directly on sidewalls of each of the vertical semiconductor channels 60. Each ferroelectric material liner 52 embeds (i.e., at least partially surrounds) a respective one of the electrically conductive layers 46 therein.

Each vertical portion of the ferroelectric material liner 52 that laterally surrounds a respective one of the vertical semiconductor channels 60 is a ferroelectric memory element that can store information in the form of a direction of remanent electric dipole moment, which may point inward or outward. Thus, each ferroelectric memory element can be an annular portion of a respective one of the ferroelectric material liners 52 that laterally surrounds a respective one of the vertical semiconductor channels 60 and located at a level between a vertically neighboring pair of insulating layers 32. Each electrically conductive layer 46 can function as a combination of a plurality of control gate electrodes for multiple ferroelectric memory elements located at a same level and a word line electrically interconnecting, i.e., electrically shorting, the plurality of control gate electrodes. Thus, the electrically conductive layers 46 include the control gate electrodes for the three-dimensional ferroelectric memory device. Each electrically conductive layer 46 can be a word line that functions as a common control gate electrode for the plurality of vertically stacked ferroelectric memory elements located at a same level and laterally surrounding a plurality of vertical semiconductor channels 60. A backside cavity 79' is present within each backside trench 79 after removal of the portions of the continuous electrically conductive material layer 46L and the continuous ferroelectric material liner 52L from inside the backside trenches 79.

Figure 11:
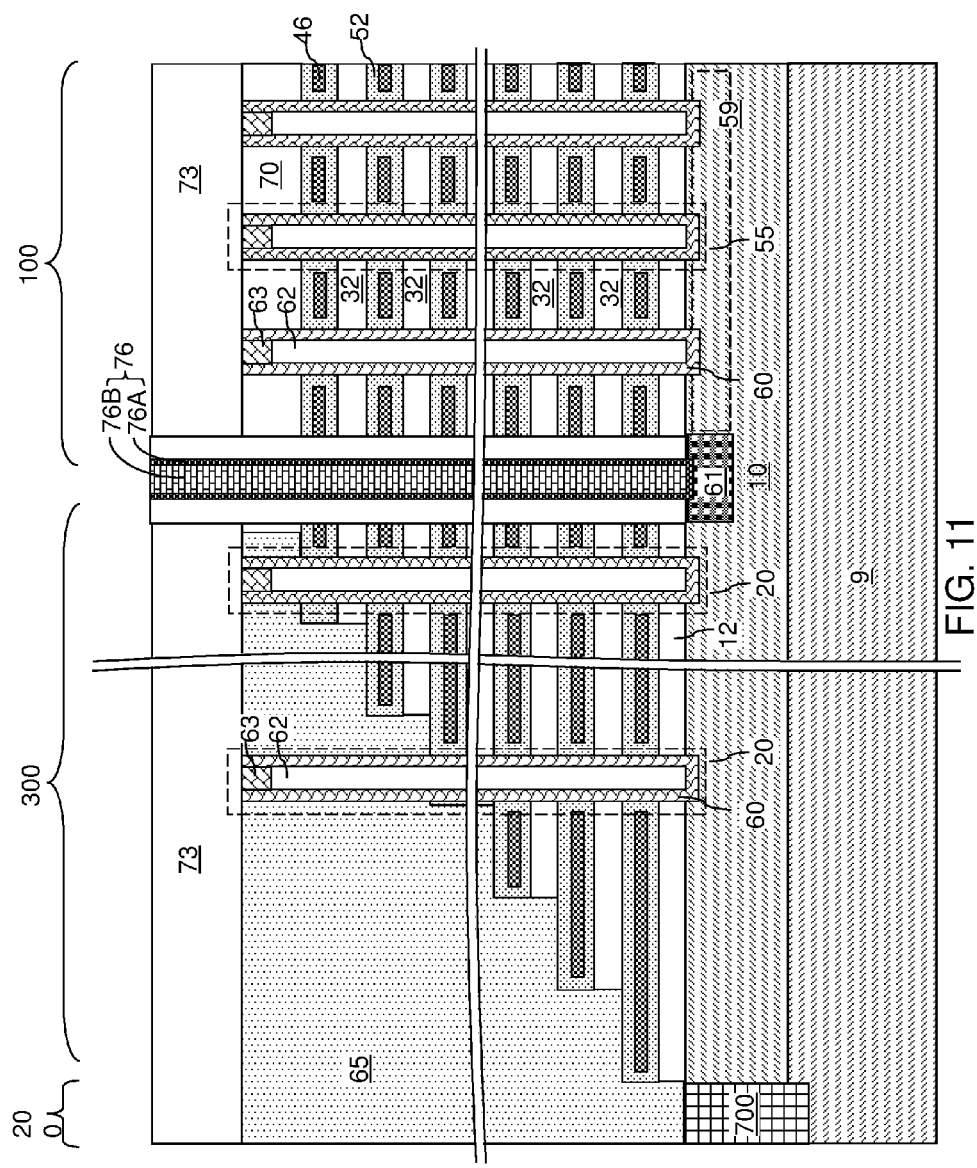
FIG. 11 is a schematic vertical cross-sectional view of the exemplary structure after formation of an insulating spacer and a backside contact structure according to an embodiment of the present disclosure.

Referring to FIG. 11, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74.

An upper portion of the semiconductor material layer 10 that extends between the source region 61 and the vertical semiconductor channels 60 constitutes a horizontal semiconductor channel 59 for a plurality of field effect transistors. The horizontal semiconductor channel 59 contacts the source region 61 and the vertical semiconductor channels 60. Each source region 61 is formed in, or on, an upper portion of the semiconductor substrate (9, 10). Semiconductor channels (59, 60) extend between each source region 61 and a respective set of drain regions 63. The semiconductor channels (59, 60) include the vertical semiconductor channels 60 of the memory opening fill structures 55.

A backside contact via structure 76 can be formed within each backside cavity 79'. Each contact via structure 76 can fill a respective cavity 79'. The backside contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. Each backside contact via structure 76 extends through the alternating stack (32, 46), and contacts a top surface of the source region 61.

Figure 12A:
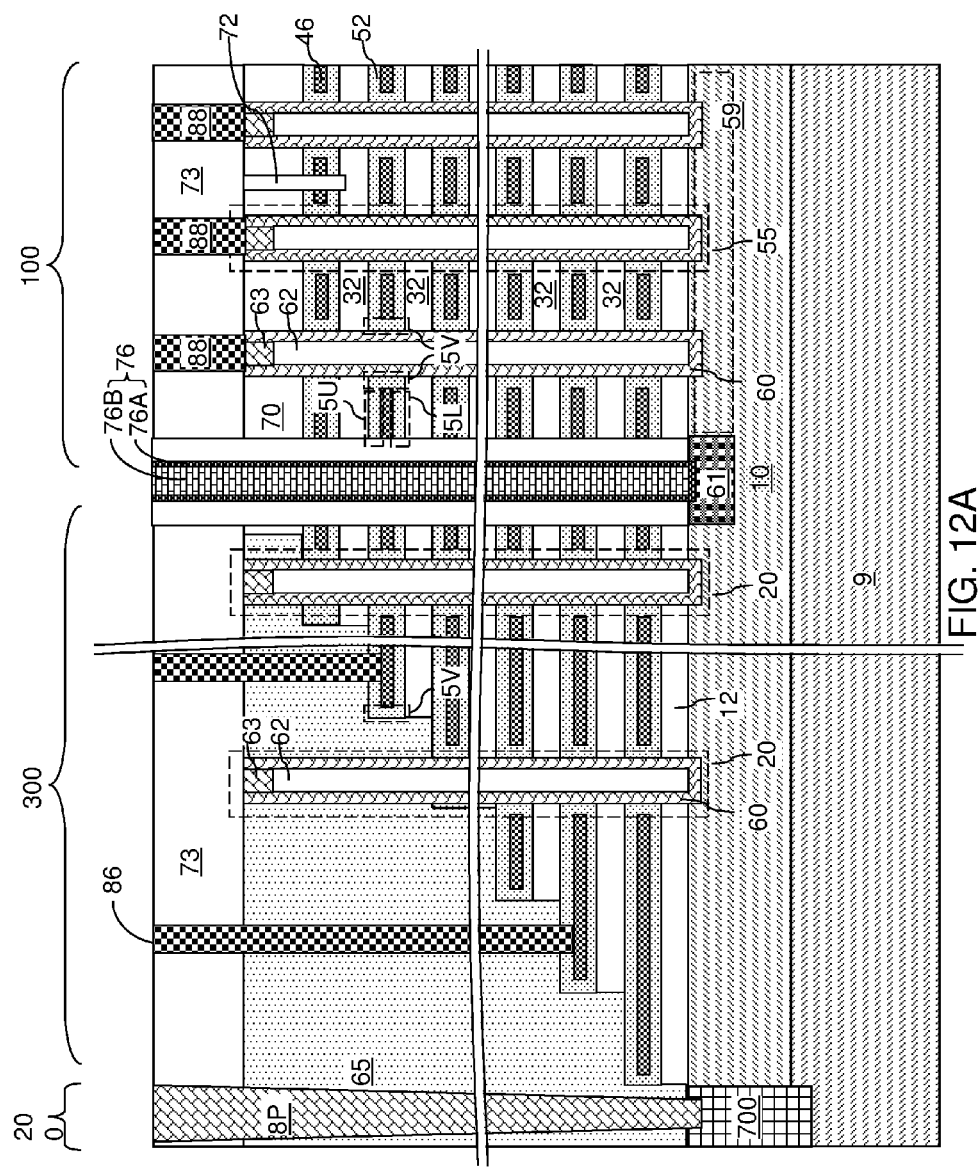
FIG. 12A is a schematic vertical cross-sectional view of the exemplary structure after formation of additional contact via structures according to an embodiment of the present disclosure.
Figure 12B:
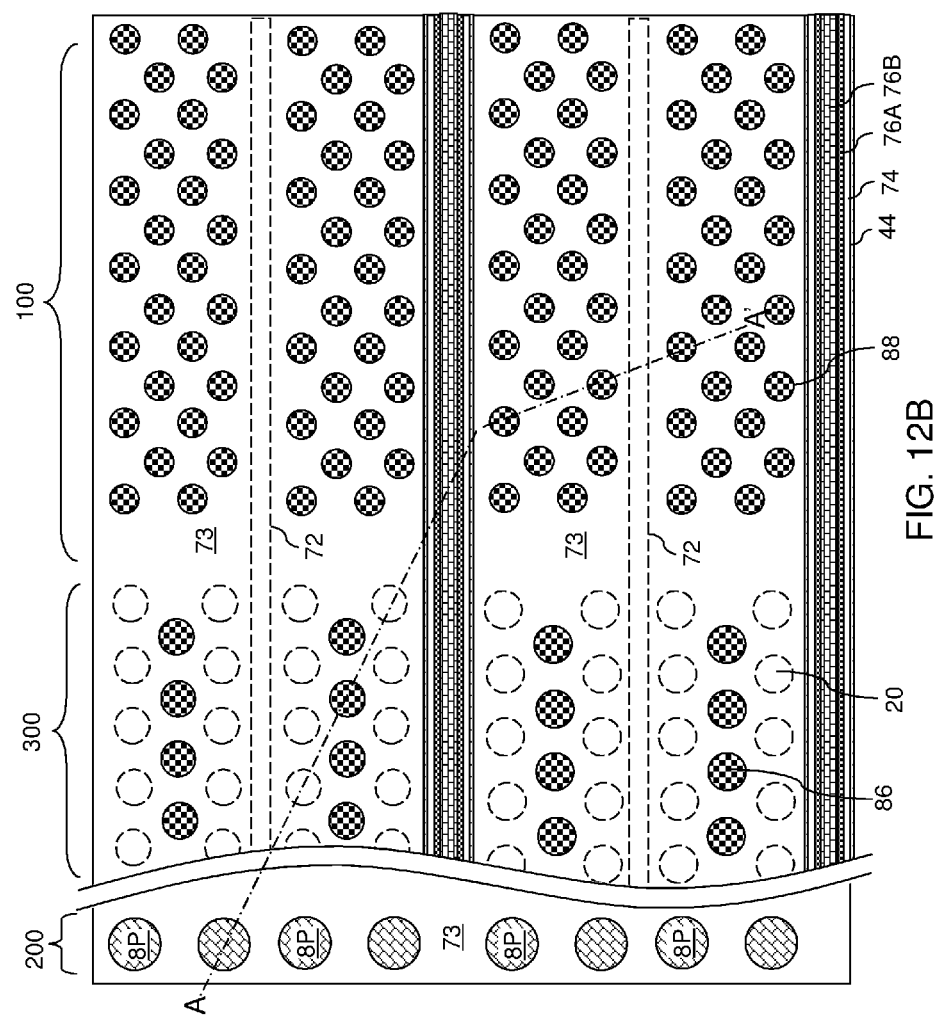
FIG. 12B is a top-down view of the exemplary structure of FIG. 12A. The vertical plane A-A' is the plane of the schematic vertical cross-sectional view of FIG. 12A.

Referring to FIGS. 12A and 12B, contact via structures can be formed through the contact level dielectric layer 73 and the retro-stepped dielectric material portion 65 and on a top surface of a respective one of the electrically conductive layers 46 within the terrace region to provide electrical contact to each of the electrically conductive layers 46, which function as word lines. These contact via structures are herein referred to as word line contact via structures 86. Each word line contact via structure 86 extends through a horizontal portion of a respective one of the ferroelectric material liners 52. Drain contact via structures 88 can be formed through the contact level dielectric layer 73 on each drain region 63. Peripheral device contact via structures 8P can be formed through the retro-stepped dielectric material portion 65 directly on respective nodes of the peripheral devices.

The exemplary structure of the present disclosure can include a three-dimensional memory device, which can include an alternating stack (32, 46) located over a substrate (9, 10), where the alternating stack comprises alternating insulating layers 32 and electrically conductive layers 46, and where the electrically conductive layers 46 comprise word lines of the three-dimensional memory device. The device also includes vertical semiconductor channels 60 vertically extending through the alternating stack (32, 46) perpendicular to the top surface of the substrate (9, 10) and a ferroelectric memory material 52 located between each vertical semiconductor channel 60 and the electrically conductive layers 46 of the alternating stack.

In one embodiment, the ferroelectric memory material comprises ferroelectric material liners 52 located in the alternating stack, and a combination of each ferroelectric material liner 52 and each electrically conductive layer 46 in the alternating stack comprises a combined spacer (52, 46). Thus, in this embodiment, the alternating stack (32, 52, 46) comprises alternating insulating layers 32 and combined spacers (52, 46). Each of the vertical semiconductor channels 60 contacts each of the respective ferroelectric material liners 52. Thus, in one embodiment, an alternating stack of insulating layers 32 and combined spacers (52, 46) is located over a substrate (9, 10), where each of the combined spacers (52, 46) comprises an electrically conductive layer 46 and a ferroelectric material liner 52 that embeds the electrically conductive layer 46 therein. Vertical semiconductor channels 60 vertically extend through an entirety of the alternating stack (32, 52, 46), where each of the vertical semiconductor channels 60 contacts each of the ferroelectric material liners 52. A semiconductor material layer 10 can be located within the substrate (9, 10), and each of the vertical semiconductor channels 60 can contact the semiconductor material layer 10. A source region 61 can be located in, or on, the semiconductor material layer 10, and can be laterally offset from the vertical semiconductor channels 10. Drain regions 63 can be located at an upper end of each of the vertical semiconductor channels 60.

In one embodiment shown in FIG. 12A, each of the ferroelectric material liners 52 can include an upper horizontal portion 5U contacting a top surface of one of the electrically conductive layers 46, a lower horizontal portion 5L contacting a bottom surface of the one of the electrically conductive layers 46, and a plurality of vertically extending cylindrical portions 5V that laterally surrounds, and contacts, a respective one of the vertical semiconductor channels 60 and vertically connecting the upper horizontal portion 5U and the lower horizontal portion 5L.

In one embodiment, the alternating stack (32, 52, 46) comprises a terrace region in which each combined spacer (52, 46) except a topmost combined spacer laterally extends farther away from the vertical semiconductor channels than overlying combined spacers. In one embodiment, the three-dimensional memory device can include a plurality of contact via structures 86 contacting a top surface of a respective one of the electrically conductive layers 46 within the terrace region. A retro-stepped dielectric material portion 65 can be provided, which overlies, and contacts, surfaces of the ferroelectric material liner 52 in the terrace region. The plurality of contact via structures 86 extends through the retro-stepped dielectric material portion 65 and a respective one of the ferroelectric material liner 52 (i.e., an upper horizontal portion 5U of the ferroelectric material liner 52). In one embodiment, each of the electrically conductive layers 46 can be vertically spaced from the retro-stepped dielectric material portion 65 by a horizontal portion of a respective one of the ferroelectric material liners 52, and can be laterally spaced from the retro-stepped dielectric material portion 65 by a vertical portion 5V of the respective one of the ferroelectric material liners 52.

In one embodiment, each of the vertical semiconductor channels 60 directly contacts a sidewall of each of the insulating layers 32 of the alternating stack (32, 52, 46) and a sidewall of each of the ferroelectric material liners 52 in the alternating stack (32, 52, 46), and is laterally spaced from each of the electrically conductive layers 46 by a respective one of the ferroelectric material liners 52. Each of the ferroelectric material liners 52 can have the same composition as the continuous ferroelectric material liner 52L described above.

The ferroelectric memory elements of the three-dimensional memory device can be written (i.e., programmed or erased), and the ferroelectric state of the ferroelectric memory elements can be read (i.e., sensed) in the following manner. Each ferroelectric memory element can be a region of one of the ferroelectric material liners located between a selected one of the electrically conductive layers and a selected one of the vertical semiconductor channels.

In case the vertical semiconductor channels 60 include a p-doped semiconductor material, and the minority charge carriers in the p-doped semiconductor channel are electrons, a selected first ferroelectric memory element can be programmed into a programmed (i.e., ON) state that locally (i.e., within the volume of the vertical semiconductor channel 60 that is laterally surrounded by the selected first ferroelectric memory element) decreases a threshold voltage inside the selected one of the vertical semiconductor channel 60 and at a level of the selected word line 46 by applying: (1) a current flow bias voltage across the source region 61 and a selected drain region 63 located at the upper end of the selected one of the vertical semiconductor channels 60; (2) a selected word line voltage to the selected word line 46, wherein the selected word line voltage is a greater positive voltage with respect to voltages applied to the source region and the selected drain region; and (3) an unselected word line voltage that is less positive than the selected word line voltage to each of unselected word lines 46. In a non-limiting illustrative example, the source region 61 can be biased at 0 V, the selected drain region 63 can be biased at 2.0 V, the selected word line (i.e., the electrically conductive layer 46 located at the same level as the selected ferroelectric memory element) can be biased at 5 V, and the unselected word lines (i.e., the rest of the electrically conductive layers 46) can be biased at 2.5 V. The drain regions 63 that are connected to the vertical semiconductor channels 60 that are not laterally surrounded by the selected ferroelectric memory element can be biased at 0 V. This programming step sets the channel threshold voltage adjacent to the programmed memory cell (i.e., adjacent to the selected word line) to a relatively low value, such as 0 V.

In case the vertical semiconductor channels 60 include a p-doped semiconductor material, and the minority charge carriers in the p-doped semiconductor channel are electrons, a selected ferroelectric memory element can be written into an erased (i.e., OFF) state that locally (i.e., within the volume of the vertical semiconductor channel 60 that is laterally surrounded by the selected first ferroelectric memory element) increases a threshold voltage inside the selected one of the vertical semiconductor channel 60 and at a level of the selected word line 46 by applying: (1) a current flow bias voltage across the source region 61 and a selected drain region 63 located at the upper end of the selected one of the vertical semiconductor channels 60; (2) a selected word line voltage to the selected word line 46, wherein the selected word line voltage is a negative voltage with respect to at least one of voltages applied to the source region 61 and the selected drain region 63; and (3) an unselected word line voltage to unselected word lines 46 that is more positive than the voltages applied to the source region 61 and the selected drain region 63. In a non-limiting illustrative example, the source region 61 can be biased at 5 V, the selected drain region 63 can be biased at 5.0 V, the selected word line (i.e., the electrically conductive layer 46 located at the same level as the selected ferroelectric memory element) can be biased at 0 V, and the unselected word lines (i.e., the rest of the electrically conductive layers 46) can be biased at 7.5 V. The drain regions 63 that are connected to the vertical semiconductor channels 60 that are not laterally surrounded by the selected ferroelectric memory element can be biased at 5 V. This erasing step sets the channel threshold voltage adjacent to the programmed memory cell (i.e., adjacent to the selected word line) to a relatively higher value, such as 1 V, which is higher than in the programmed.

The ON or OFF state of a selected ferroelectric memory element (as embodied as a region of one of the ferroelectric material liners 52 located between a selected word line 46 and a selected one of the vertical semiconductor channels 60) can be read by applying: (1) a current flow bias voltage across the source region 61 and a selected drain region 63 located at the upper end of the selected one of the vertical semiconductor channels 60; (2) a selected word line voltage to the selected word line 46, wherein the selected word line voltage is at one of, or is between, voltages applied to the source region 61 and the selected drain region 63; and (3) an unselected word line voltage applied to the unselected word lines and is more positive than the voltages applied to the selected word line 46, the source region 61 and the selected drain region 63. In a non-limiting illustrative example, the source region 61 can be biased at 0 V, the selected drain region 63 can be biased at 1 to 2 V, the selected word line (i.e., the electrically conductive layer 46 located at the same level as the selected ferroelectric memory element) can be biased at 1 to 1.5 V, and the unselected word lines (i.e., the rest of the electrically conductive layers 46) can be biased at 2.5 V (one half of the programming voltage applied to the selected word line 46). This provides a voltage between the source and the drain regions that is greater than the threshold voltage of the channel in the erased memory cells to keep the current flowing in the semiconductor channel between the source and the respective drain. The drain regions 63 that are connected to the vertical semiconductor channels 60 that are not laterally surrounded by the selected ferroelectric memory element can be biased at 0 V.

The exemplary structure of the present disclosure provide a three-dimensional array of ferroelectric memory elements that can be accessed through selection of a vertical semiconductor channel 60 (through selection of voltages applied to the drain regions 63) and a word line (through application of a voltage to the selected electrically conductive layer 46). A high density three dimensional memory device including the ferroelectric memory elements can be provided, and operated. The ferroelectric memory element can retain the orthorhombic phase by forming it toward the end of the device fabrication process by a replacement process after all of the high temperature steps have been completed.

Compared to a three dimensional NAND device, in the ferroelectric device of the present embodiment, both size (e.g., diameter) of the memory opening 49 and word line 46 thickness can be smaller. The memory material does not have to be formed in the memory opening 49, such that memory opening size scaling is possible because the polysilicon channel contacts the sidewall of the memory opening. Furthermore, only a single layer of polysilicon can be used to deposit the semiconductor channel 60 and an extra etch of the memory film at the bottom of the memory opening is not required for the vertical semiconductor channel 60 to contact the horizontal semiconductor channel 59. The ferroelectric material liner 52 can be thinner than a NAND memory film and the device switching voltage can be much lower. The ferroelectric memory device also provides a higher gate capacitance for the same device size, improved gate control and shorter total channel length which leads to a higher drive current for faster read-out.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack located over a substrate, wherein the alternating stack comprises alternating insulating layers and electrically conductive layers, and wherein the electrically conductive layers comprise word lines of the three-dimensional memory device;
   vertical semiconductor channels vertically extending through the alternating stack; and
   ferroelectric memory elements located between each vertical semiconductor channel and the electrically conductive layers of the alternating stack,
   wherein:
     the ferroelectric memory elements comprise ferroelectric material liners located in the alternating stack;
     a combination of each ferroelectric material liner and each electrically conductive layer in the alternating stack comprises a combined spacer;
     the alternating stack comprises alternating insulating layers and combined spacers; and
     each of the vertical semiconductor channels contacts each of the ferroelectric material liners, and wherein the three-dimensional memory device comprises at least one feature selected from:
       a first feature that the three-dimensional memory device further comprises:
         a semiconductor material layer located on or within the substrate, wherein each of the vertical semiconductor channels contacts the semiconductor material layer,
         a source region located in, or on, the semiconductor material layer and laterally offset from the vertical semiconductor channels, and
         drain regions located at an upper end of each of the vertical semiconductor channels;
       a second feature that the alternating stack comprises a terrace region in which each combined spacer except a topmost combined spacer laterally extends farther away from the vertical semiconductor channels than overlying combined spacers, and the three-dimensional memory device further comprises a plurality of contact via structures contacting a top surface of a respective one of the electrically conductive layers within the terrace region; and
       a third feature that the ferroelectric material liners comprise an orthorhombic metal oxide whose unit cell has a non-zero permanent electric dipole moment.

2. The three-dimensional memory device of claim 1, wherein each of the ferroelectric material liners comprises:
   an upper horizontal portion contacting a top surface of one of the electrically conductive layers;
   a lower horizontal portion contacting a bottom surface of the one of the electrically conductive layers; and
   a plurality of vertically extending cylindrical portions that laterally surrounds, and contacts, a respective one of the vertical semiconductor channels and vertically connecting the upper horizontal portion and the lower horizontal portion.

3. The three-dimensional memory device of claim 1, wherein the three-dimensional memory device comprises the first feature.

4. The three-dimensional memory device of claim 1, wherein the three-dimensional memory device comprises the second feature.

5. The three-dimensional memory device of claim 4, further comprising a retro-stepped dielectric material portion overlying, and contacting, surfaces of the ferroelectric material liner in the terrace region,
wherein:
the plurality of contact via structures extends through the retro-stepped dielectric material portion and a respective one of the ferroelectric material liners; and
each of the electrically conductive layers is vertically spaced from the retro-stepped dielectric material portion by a horizontal portion of a respective one of the ferroelectric material liners, and is laterally spaced from the retro-stepped dielectric material portion by a vertical portion of the respective one of the ferroelectric material liners.

6. The three-dimensional memory device of claim 1, wherein each of the vertical semiconductor channels directly contacts a sidewall of each of the insulating layers of the alternating stack and a sidewall of each of the ferroelectric material liners in the alternating stack, and is laterally spaced from each of the electrically conductive layers by a respective one of the ferroelectric material liners.

7. The three-dimensional memory device of claim 1, wherein the three-dimensional memory device comprises the third feature.

8. The three-dimensional memory device of claim 7, wherein the orthorhombic metal oxide comprises an orthorhombic hafnium doped zirconium oxide or an orthorhombic hafnium oxide doped with a dopant having an atomic radius that is between 40% smaller to 15% larger than the atomic radium of hafnium.

9. The three-dimensional memory device of claim 8, wherein:
the orthorhombic metal oxide comprises an orthorhombic hafnium oxide doped with at least one of silicon, aluminum, yttrium, gadolinium and zirconium;
each of the ferroelectric material liners is a conformal material layer having a thickness variation that is less than 30% from an average thickness; and
an average thickness of the ferroelectric material liners is in a range from 5 nm to 30 nm.

10. A method of forming a three-dimensional memory device, comprising:
forming an alternating stack of insulating layers and sacrificial material layers over a substrate;
forming vertical semiconductor channels through the alternating stack; and
replacing the sacrificial material layers with combined spacers, each of which comprises a ferroelectric liner and an electrically conductive layer, after forming the vertical semiconductor channels,
wherein the method comprises at least one feature selected from:
a first feature that the method further comprises: forming a backside trench through the alternating stack of the insulating layers and the sacrificial material layers, and removing the sacrificial material layers by providing an etchant that etches the sacrificial material layers selective to the insulating layers through the backside trench, wherein backside recesses are formed in volumes from which the sacrificial material layers are removed, wherein the combined spacers are formed in the backside recesses;
a second feature that the method further comprises: patterning the alternating stack to form a terrace region in which each sacrificial material layer except a topmost sacrificial material layer has a greater lateral extent than overlying sacrificial material layers, forming a retro-stepped dielectric material portion over the alternating stack in the terrace region, and forming a plurality of contact via structures through the retro-stepped dielectric material portion and on a top surface of a respective one of the electrically conductive layers within the terrace region; and
a third feature that that the ferroelectric material liners comprise an orthorhombic metal oxide of which a unit cell has a permanent non-zero electric dipole moment, and the orthorhombic metal oxide comprises an orthorhombic hafnium doped zirconium oxide or an orthorhombic hafnium oxide doped with a dopant having an atomic radius that is between 40% smaller than to 15% larger than the atomic radium of hafnium.

11. The method of claim 10, wherein:
the substrate comprises a semiconductor material layer therein or thereon;
each of the vertical semiconductor channels is formed directly on the semiconductor material layer; and
the method further comprises:
forming a source region in, or on, the semiconductor material layer at a location that is laterally offset from the vertical semiconductor channels; and
forming drain regions at an upper end of each of the vertical semiconductor channels.

12. The method of claim 10, wherein the method comprises the first feature.

13. The method of claim 12, wherein the combined spacers are formed by:
depositing a continuous ferroelectric material liner in the backside recesses and at a periphery of the backside trench;
depositing a conductive material in remaining volumes of the backside recesses and on portions of the continuous ferroelectric material liner in the backside trench; and
removing portions of the conductive material and the continuous ferroelectric material liner from inside the backside trench,
wherein remaining portions of the continuous ferroelectric material liner in the backside recesses constitute the ferroelectric material liners that directly contact sidewalls of each of the vertical semiconductor channels, and remaining portions of the conductive material in the backside recesses constitute the electrically conductive layers which comprise word lines.

14. The method of claim 10, wherein the method comprises the second feature.

15. The method of claim 10, wherein the method comprises the third feature.

16. The method of claim 15, wherein:
the orthorhombic metal oxide comprises an orthorhombic hafnium oxide doped with at least one of silicon, aluminum, yttrium, gadolinium and zirconium which is annealed at a temperature between 500 and 850 degrees Celsius after deposition;
each of the ferroelectric material liners is a conformal material layer having a thickness variation that is less than 30% from an average thickness; and
an average thickness of the ferroelectric material liners is in a range from 5 nm to 30 nm.

17. A method of operating a ferroelectric three-dimensional memory device comprising an alternating stack of word lines and insulating layers, a vertical semiconductor channel, a source region, a drain region and a ferroelectric memory elements, the method comprising:

writing a selected first ferroelectric memory material element between a selected word line and the vertical semiconductor channels into a state that locally decreases a threshold voltage inside the vertical semiconductor channel at a level of the selected word line by applying:
a current flow bias voltage across the source region and the drain region of the vertical semiconductor channel;
a selected word line voltage to the selected word line, wherein the selected word line voltage is a greater positive voltage with respect to voltages applied to the source region and the drain region; and
an unselected word line voltage to each unselected word line that is less positive than the selected word line voltage.

18. The method of claim 17, further comprising:
writing the selected first region of the ferroelectric memory element into a state that locally increases the threshold voltage inside the vertical semiconductor channel at the level of the selected word line by applying:
a current flow bias voltage across the source region and the drain region of the vertical semiconductor channel;
a selected word line voltage to the selected word line, wherein the selected word line voltage is a negative voltage with respect to at least one of voltages applied to the source region and the selected drain region; and
an unselected word line voltage to each unselected word line that is more positive than the voltages applied to the source region and the selected drain region.

19. The method of claim 17, further comprising:
reading a state of the first selected ferroelectric memory element by applying:
a current flow bias voltage across the source region and the drain region of the vertical semiconductor channels;
a selected word line voltage to the selected word line, wherein the selected word line voltage is equal to one of, or is between, voltages applied to the source region and the selected drain region; and
an unselected word line voltage to each unselected word line that is more positive than the voltages applied to the source region and the drain region.

* * * * *